United States Patent
Leal et al.

(10) Patent No.: US 7,892,882 B2
(45) Date of Patent: Feb. 22, 2011

(54) METHODS AND APPARATUS FOR A SEMICONDUCTOR DEVICE PACKAGE WITH IMPROVED THERMAL PERFORMANCE

(75) Inventors: George R. Leal, Cedar Park, TX (US); Victor A. Chiriac, Phoenix, AZ (US); Tien Yu T. Lee, Phoenix, AZ (US); Marc A. Mangrum, Manchaca, TX (US); Robert J. Wenzel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 132 days.

(21) Appl. No.: 11/450,070

(22) Filed: Jun. 9, 2006

(65) Prior Publication Data

US 2007/0284704 A1    Dec. 13, 2007

(51) Int. Cl.
*H01L 21/00*  (2006.01)
(52) U.S. Cl. ..................... 438/106; 257/678
(58) Field of Classification Search .............. 256/666; 438/106
See application file for complete search history.

(56) References Cited

U.S. PATENT DOCUMENTS

| | | | |
|---|---|---|---|
| 5,608,267 A | 3/1997 | Mahulikar | |
| 5,841,193 A | 11/1998 | Eichelberger | |
| 6,159,767 A | 12/2000 | Eichelberger | |
| 6,838,776 B2* | 1/2005 | Leal et al. | 257/783 |
| 6,841,413 B2 | 1/2005 | Liu | |
| 6,872,591 B1 | 3/2005 | Wang | |
| 6,921,968 B2 | 7/2005 | Chung | |
| 6,921,975 B2 | 7/2005 | Leal | |
| 6,924,549 B2 | 8/2005 | Nose | |
| 2004/0155325 A1* | 8/2004 | Ma et al. | 257/678 |
| 2004/0188831 A1 | 9/2004 | Hsiao | |
| 2005/0046001 A1* | 3/2005 | Warner | 257/678 |
| 2005/0242428 A1 | 11/2005 | Shim | |

FOREIGN PATENT DOCUMENTS

| | | |
|---|---|---|
| EP | 0777274 A1 | 4/1997 |
| WO | WO 02/33751 A2 | 4/2002 |

* cited by examiner

*Primary Examiner*—Kimberly D Nguyen
*Assistant Examiner*—Tony Tran
(74) *Attorney, Agent, or Firm*—Ingrassia Fisher & Lorenz, P.C.

(57) ABSTRACT

A package assembly 200 includes a semiconductor die (e.g., an RF power amplifier) 208 fixed within the cavity of a conductive leadframe 204 using a thermally and electrically-conductive adhesive material 209. The semiconductor die 209 has a first side and a second side, wherein the first side includes at least one active area, and the second side includes at least one contact region. The conductive leadframe (e.g., a copper leadframe) 204 has two planar surfaces and a cavity formed therein. The adhesive material 209 is configured to couple the semiconductor die 208 within the cavity of the conductive leadframe 204 such that the first side of the semiconductor die is substantially coplanar with the first surface of the conductive leadframe.

10 Claims, 7 Drawing Sheets

METHODS AND APPARATUS FOR A SEMICONDUCTOR DEVICE PACKAGE WITH IMPROVED THERMAL PERFORMANCE

TECHNICAL FIELD

The present invention relates generally to electronic package assemblies, and more particularly, to leadframe designs for power amplifier dies in wafer-level, embedded chip package assemblies.

BACKGROUND

The trend toward more compact electrical devices has driven the need for smaller semiconductor packaging techniques, such that the package itself is commonly on the order of the size of the semiconductor die itself. As the density of such components increases, the need for advanced heat transfer techniques becomes increasingly significant, particularly with respect to power amplifier devices and other such high-power semiconductor die.

Radio frequency (RF) power amplifier components, for example, are typically relatively small, but dissipate large amounts of heat during operation. Embedded die package techniques—wherein the die's active side faces downward with respect to the build-up circuits—do not lend themselves well to managing thermal output due to the limitation in the number of thermal vias that can contact the active face of the die, and because backside contact is not always provided. As a result, the die junction temperature in such packaging schemes may exceed the limit of 150° C. during operation. For this reason, power amplifier devices typically incorporate backside contact for grounding purposes.

Accordingly, it is desirable to provide designs which enable greater amounts of heat to be dissipated during operation than current designs. Furthermore, other desirable features and characteristics of the present invention will become apparent from the subsequent detailed description and the appended claims, when taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures, and wherein:

DETAILED DESCRIPTION

The following detailed description is merely illustrative in nature and is not intended to limit the scope or application of possible embodiments. Furthermore, there is no intention to be bound by any expressed or implied theory presented in the preceding technical field, background, brief summary or the following detailed description.

Various embodiments may be described herein in terms of functional and/or logical block components and various processing steps. It should be appreciated that such block components may be realized by any number of hardware, software, and/or firmware components configured to perform the specified functions. For the sake of brevity, conventional techniques and systems related to semiconductor processing, packaging, radio frequency (RF) devices, and power amplifiers are not treated in exhaustive detail herein.

Figure 1:
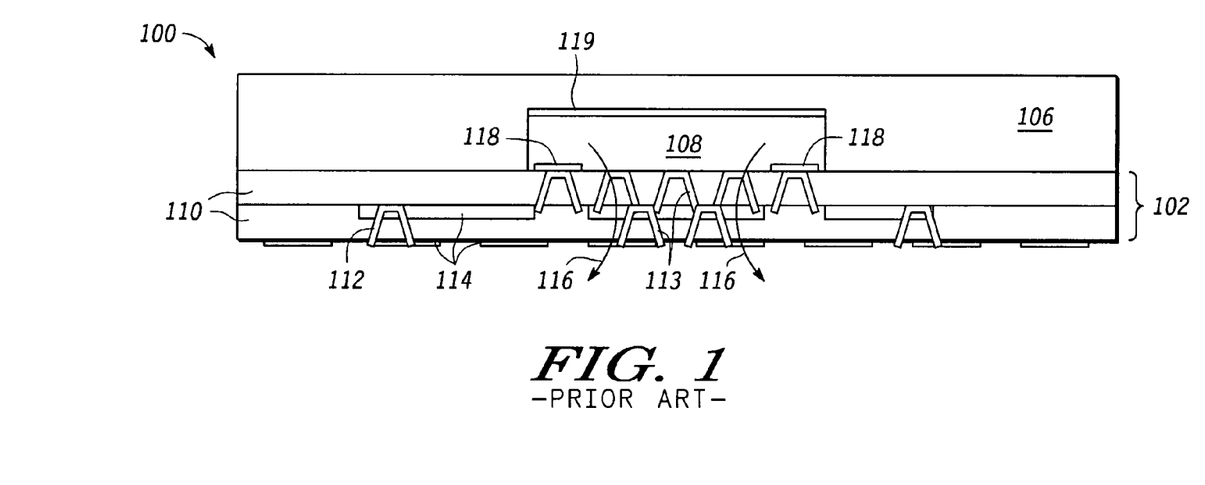
FIG. 1 is a cross-sectional overview of a typical prior art electronic package assembly.

As mentioned above, prior art embedded chip packaging schemes are unsatisfactory in a number of respects. With reference to FIG. 1, for example, a conventional electronic package assembly 100 includes a semiconductor die 108 incorporating one or more active terminal bond pad contacts 118, wherein a backside 119 of semiconductor die 108 is surrounded by an encapsulant 106. Furthermore, semiconductor die 108 is in contact with a build-up circuit 102, wherein build-up circuit 102 includes one or more layers 110 incorporating various electrical vias 112, thermal vias 113, contact pads 114, and the like. Such baseband integrated circuits, transceivers, power management modules, and the like may be used in an integrated radio application. Additional information regarding embedded chip structures may be found, for example, in U.S. Pat. No. 6,838,776 and U.S. Pat. No. 6,921,975, owned by the present assignee. The present invention is not so limited, however, any may be used in the context of traditional "chip-first" packages or any other embedded chip application.

Encapsulant 106 is typically an epoxy or other polymeric material, and may include various glass and/or plastic filler materials. As a result, its thermal conductivity is relatively low, and thus does not provide an effective heat conduction path to the environment. Generated heat is therefore primarily dissipated away from semiconductor die 108 via heat paths 116. Generally, heat paths 116 that are provided by thermal vias 113 are not, by themselves, capable of dissipating the entire amount of heat generated by semiconductor die 108 when semiconductor die 108 is, for example, a power amplifier.

Figure 2:
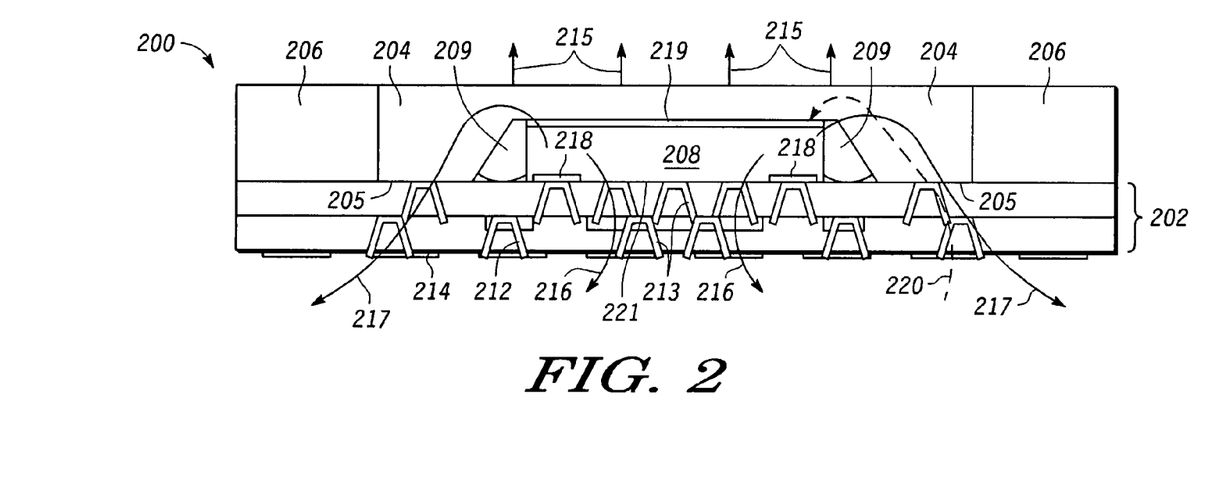
FIG. 2 is a cross-sectional overview of an electronic package assembly in accordance with one exemplary embodiment.

FIG. 2 depicts an electronic package assembly 200 in accordance with one embodiment of the present invention.

Electronic package assembly 200 includes a semiconductor die 208 (e.g., an RF power amplifier or other such device) having one or more active terminal bond pad contacts 218 formed on and/or within die 208. Die 208 is fixed within a cavity (shown in FIG. 5 as reference numeral 210) of a conductive leadframe or heat spreader 204 (hereinafter conductive leadframe) using a thermally and/or electrically conductive adhesive material 209. Conductive leadframe 204 includes two substantially planar surfaces on opposite sides of cavity 210. Conductive leadframe 204 functions, in accordance with one aspect, as a heat spreader (assisting in lateral conduction of heat energy), and thus may be referred to herein alternatively as a "heat spreader."

Conductive leadframe 204 may be formed of any material suitable for conducting heat and/or electricity (e.g., aluminum, ceramic, a metal, an alloy, or other similar thermally and/or electrically conductive material). In accordance with one embodiment, for example, conductive leadframe 204 is formed of copper or a copper alloy.

The geometry of conductive leadframe 204 may be selected to achieve any desired design objectives, and therefore may vary in dimensions depending upon, among other things, the dimensions and steady-state heat dissipation of die 208. In one embodiment, for example, conductive leadframe 204 is at least 1.5 times larger in area (viewed from a plan view) than semiconductor die 208. In other exemplary embodiments, conductive leadframe 204 is in the range of about 1.5 times to about 5.0 times larger than semiconductor die 208. It will be appreciated, however, that the invention is not so limited.

Adhesive material 209 suitably connects semiconductor die 208 to conductive leadframe 204 such that a front side 221 (i.e., the active side) of semiconductor die 208 is substantially coplanar with front sides 205 of conductive leadframe 204. Furthermore, a backside 219 (i.e., the side including a conductive contact) is electrically and/or thermally coupled to conductive leadframe 204. In this way, the exposed active area of semiconductor die 208, with a ready-to-mount package, may be processed with a build-up circuit 202 (e.g., a surface including electrical vias 212, thermal vias 213, other thermal management components, and/or contact pads 214) while at the same time providing an electrical connection 220 (e.g., a ground connection) to back side 219. Thus, the finished component may be processed as though it were a die being placed in a traditional embedded chip process flow. That nature of such mounting and packaging processes are known in the art, and thus need not be described herein.

Embodiments of electrical package assembly 200 contemplate that adhesive material 209 may be any material or combination of materials capable of bonding semiconductor die 208 to conductive leadframe 204, and capable of conducting heat away from die 208 and, optionally, providing an electrical path to backside 219 of die 208. In accordance with one exemplary embodiment, adhesive material 209 is a silver-filled epoxy. In another exemplary embodiment, adhesive material 209 is conventional solder material. In general, the term "thermally-conductive" as used herein with reference to a material means that the material has a thermal conductivity greater than that of the surrounding encapsulant 206. In one embodiment, for example, encapsulant 206 is a conventional silica-filled epoxy resin with a thermal conductivity ranging from about 0.5-1.0 W/mK, and adhesive material 209 has a thermal conductivity greater than 1.0 W/mK, preferably about 2.0 W/mK or greater.

Conductive leadframe 204, adhesive material 209, and semiconductor die 208 are fixed in place by encapsulant 206, which is similar to encapsulant 106 discussed above with reference to FIG. 1. As such, heat is dissipated from semiconductor die 208 via heat paths 215 and heat paths 217, in addition to heat paths 216, during operation of electronic package assembly 200.

Figure 3:
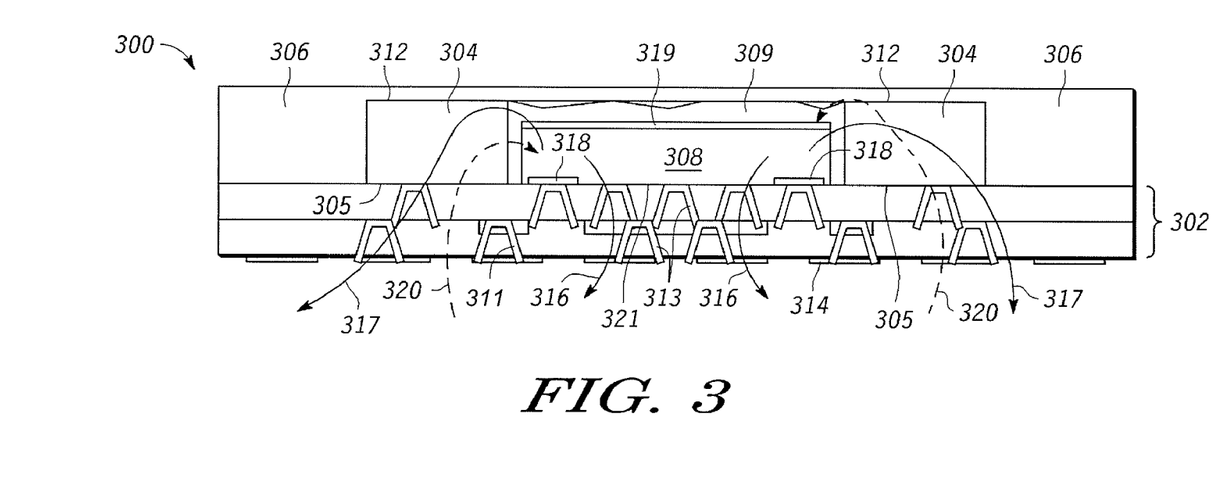
FIG. 3 is a cross-sectional overview of another exemplary embodiment of an electronic package assembly.

FIG. 3 is a diagram of an embodiment of an electronic package assembly 300. Electronic package assembly 300 includes a semiconductor die 308 having active terminal bond pad contacts 318 positioned within a conductive leadframe 304 using a thermally and/or electrically conductive adhesive material 309, wherein semiconductor 308 is similar to semiconductor die 208, conductive leadframe 304 is similar to conductive leadframe 204, and adhesive material 309 is similar to conductive adhesive material 209.

Adhesive material 309 connects semiconductor die 308 to conductive leadframe 304 such that a front side 321 (i.e., the active side) of semiconductor die 308 is substantially coplanar with front sides 305. Furthermore, a back side 319 (i.e., the side including a conductive contact) of semiconductor die 308 is electrically and/or thermally connected to conductive leadframe 304. In this way, the exposed active area of semiconductor die 308, with a ready-to-mount package, may be further processed with a build-up circuit 302 (which includes electrical vias 311, thermal vias 313 or other thermal management components, and/or contact pads 314 while at the same time providing an electrical connection 320 (e.g., a ground connection) to back side 319.

In accordance with one exemplary embodiment, conductive leadframe 304 is collectively at least 1.5 times larger in area than semiconductor die 308. In another exemplary embodiment, conductive leadframe 304 is collectively in the range of about 1.5 times to about 5.0 times larger in overall planar area than semiconductor die 308.

In accordance with another exemplary embodiment, semiconductor die 308, conductive leadframe 304, and adhesive material 309 are surrounded by an encapsulant 306 using means known in the art, wherein encapsulant 306 is similar to encapsulant 106 discussed above. As such, heat is dissipated from semiconductor die 308 via heat paths 317, in addition to heat paths 316, during operation of electronic package assembly 300.

Figure 4:
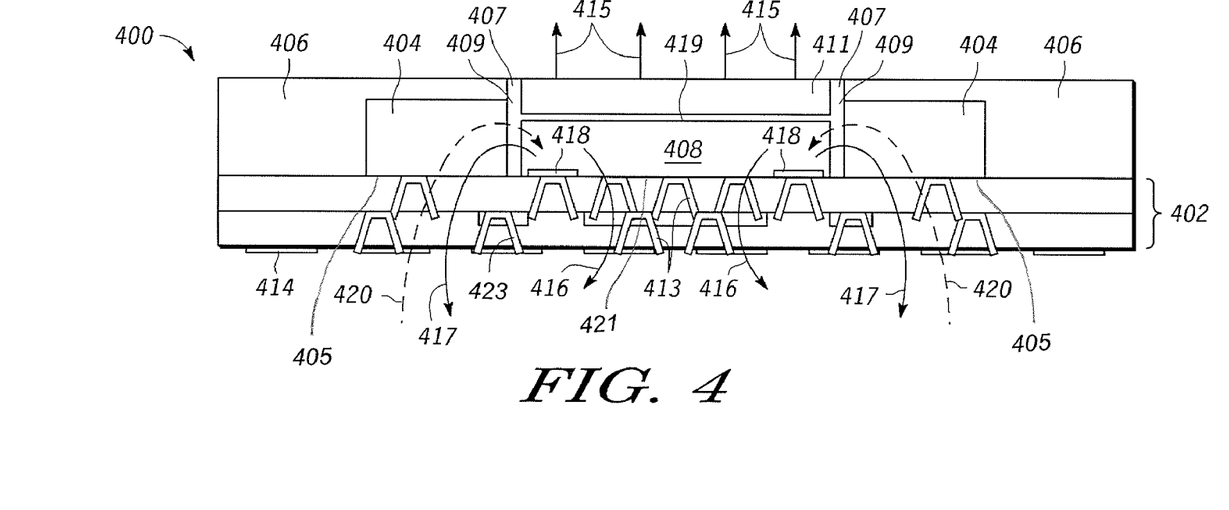
FIG. 4 is a cross-sectional overview of yet another exemplary embodiment of an electronic package assembly.

FIG. 4 is a diagram of one embodiment of an electronic package assembly 400. Electronic package assembly 400 includes a semiconductor die 408 having active terminal bond pad contacts 418 fixed between a conductive leadframe 404 using a thermally and/or electrically conductive adhesive material 409, similar to semiconductor die 308, conductive leadframe 304, and adhesive material 309, respectively.

Similar to above, adhesive material 409 connects semiconductor die 408 to conductive leadframe 404 such that a front side 421 (i.e., the active side) of semiconductor die 408 is substantially coplanar with front sides 405 of conductive leadframe 404. Furthermore, a back side 419 (i.e., the side including a conductive contact) is electrically and/or thermally coupled to conductive leadframe 404. In this way, the exposed active area of semiconductor die 408, with a ready-to-mount package, may be further processed with a build-up circuit 402 (which includes electrical vias 423, thermal vias 413, other thermal management components, and/or contact pads 414) while at the same time providing an electrical connection 420 to back side 419.

In accordance with one exemplary embodiment, semiconductor die 408 and conductive leadframe 404 are connected to a lid 411 using adhesive material 409. Furthermore, in one embodiment, lid 411 includes one or more vents 407 through it such that adhesive material 409 flows through vents 407 during, for example, manufacturing.

In accordance with one exemplary embodiment, conductive leadframe 404, and lid 411 are collectively at least 1.5 times larger in area than semiconductor die 408. In another exemplary embodiment, conductive leadframe 404, and lid 411 are collectively in the range of about 1.5 times to about 5.0 times larger in overall planar area than semiconductor die 408.

In one embodiment, an encapsulant 406 is connected to lid 411 and conductive leadframe 404 using adhesive material 409, wherein encapsulant 406 is similar to encapsulant 106 discussed above. As such, heat is dissipated from semiconductor die 408 via heat paths 415 and heat paths 417, in addition to heat paths 416, during operation of electronic package assembly 400.

In an alternate embodiment, conductive leadframe 404 may be of varying thickness and back side 419 is left exposed to enable the adaptation of a heat spreader (e.g., lid 411) as a post assembly process. As such, encapsulant 406 encapsulates conductive leadframe 404 up to both edges of semiconductor die 408 leaving a cavity over back side 419. The cavity may include any dimensions and/or shape consistent with the dimensions of semiconductor die 408. Moreover, back side 419 does not necessarily need to be planar with the top surface of electronic package assembly 400. Furthermore, adhesive material 409 or a similarly dispensed adhesive material or film adhesive can be utilized to attach the heat dissipating device to back side 419.

Figure 5:
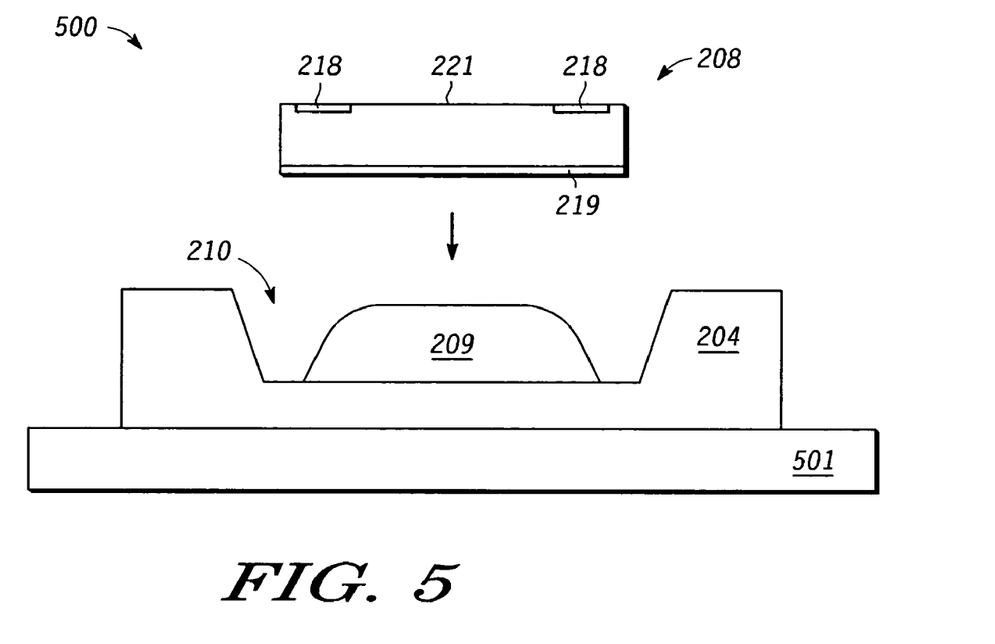
FIG. 5 is a cross-sectional overview of one step of an exemplary embodiment of a process to produce the electronic package assembly of FIG. 2.

FIG. 5 is a diagram of one step of an exemplary embodiment of a process 500 to produce electronic package assembly 200. Process 500 initiates by providing a tooling fixture 501. Next, conductive leadframe 204 is placed on planar construction base 501 and a controlled amount of adhesive material 209 is dispensed within a cavity 210 of conductive leadframe 204.

Figure 6:
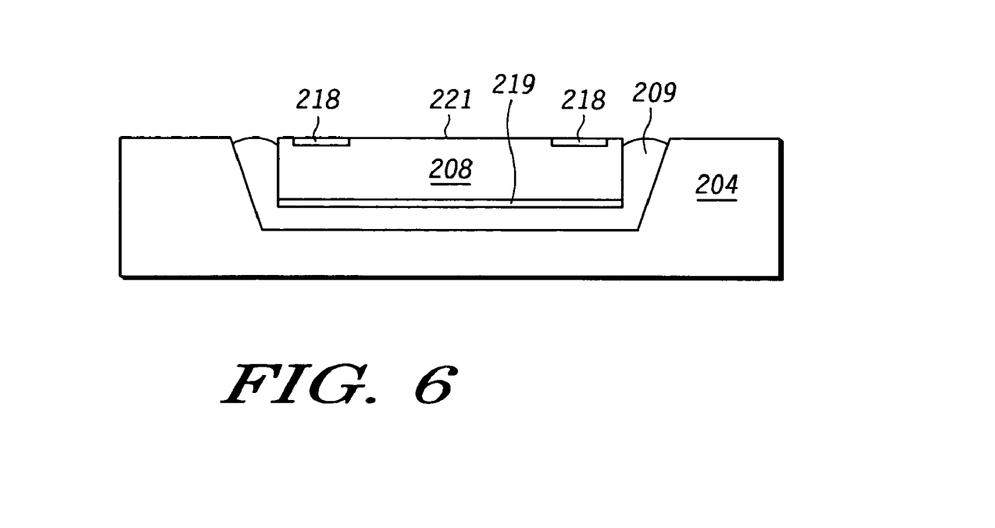
FIG. 6 is a cross-sectional overview of another step in the process of FIG. 5.

As shown in FIG. 6, semiconductor die 208 is then placed on adhesive material 209 in cavity 210 so that back side 219 comes into contact with adhesive material 209. The amount of adhesive material 209 should be an amount such that, when cured, adhesive material 209 is coplanar or substantially coplanar with front side 221. Moreover, it is important to ensure that adhesive material 209 does not come into contact with front side 221 or with active terminal bond pad contacts 218 during process 500. Next, encapsulant 206 (not shown) is appropriately connected to leadframe 204, and electronic package assembly 200 is removed from tooling fixture 501.

Notably, although FIGS. 5 and 6 have been discussed with respect to a single electronic package assembly 200, one skilled in the art will appreciate that during process 500 multiple electronic package assemblies 200 may be produced. As such, process 500 is not limited to producing a single electronic package assembly 200.

Moreover, although FIGS. 5 and 6 have been discussed with respect to a two layer metallization build-up process, one skilled in the art knows that during process 500 more than two layers may be produced. As such, process 500 is not limited to producing a specific number of layers.

Furthermore, although FIGS. 5 and 6 discuss utilizing adhesive material 209, one skilled in the art would recognize that a thermally conductive film adhesive could also be utilized. In such case, conductive leadframe 204 does not require any particular shape or vents, and may result in a thinner and easier package to manufacture.

Figure 7:
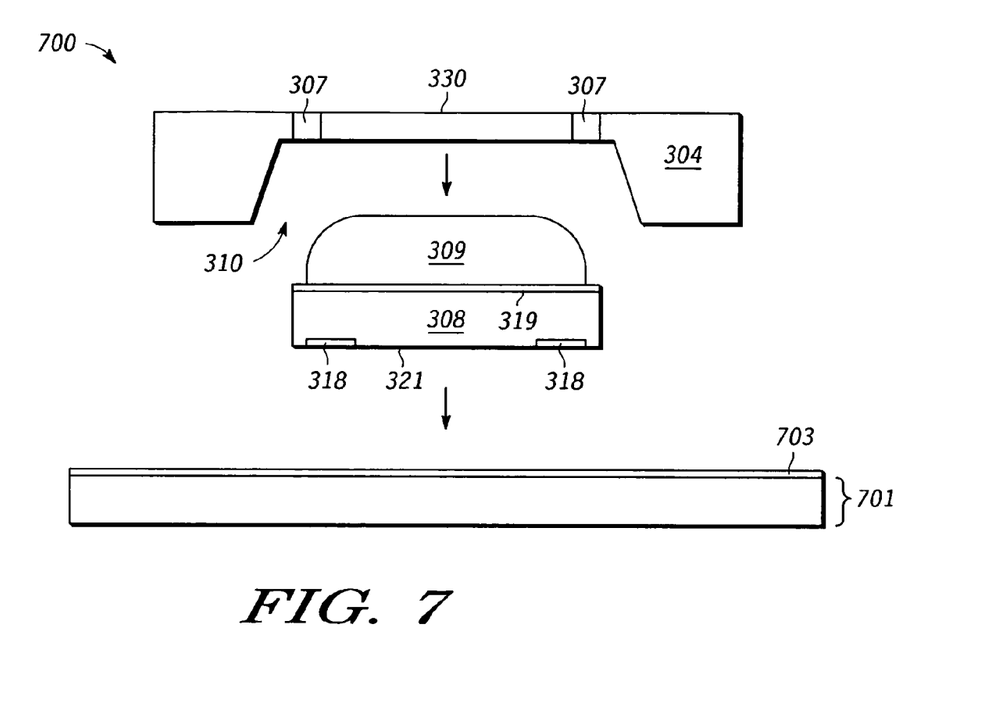
FIG. 7 is a cross-sectional overview of one step of an exemplary embodiment of a process to produce the electronic package assembly of FIG. 3.

FIG. 7 is a diagram of one step of an exemplary embodiment of a process 700 to produce electronic package assembly 300. Process 700 initiates by providing a planar construction base 701 (e.g., a silicon wafer) on which a temporary tape 703 is placed. Next, front side 321 (including active terminal bond pad contacts 318) of semiconductor die 308 is placed upon temporary tape 703.

In accordance with one exemplary embodiment, a controlled amount of adhesive material 309 is then dispensed on back side 319. Leadframe 304 is then placed over semiconductor die 308 and adhesive material 309 such that semiconductor die 308 and adhesive material 309 fit within a cavity 310 of conductive leadframe 304.

Figure 8:
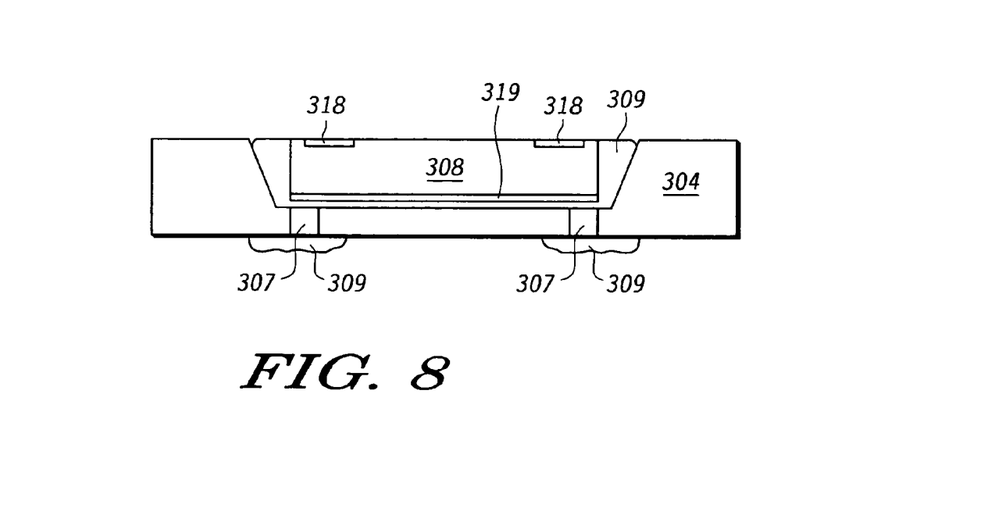
FIG. 8 is a cross-sectional overview of another step in the process of FIG. 7.

FIG. 8 shows electronic package assembly 300 after the respective portions have been connected to one another. Notably, at this point conductive leadframe 304 includes a portion 330 having vents 307 such that adhesive material 309 substantially fills cavity 310 and vents 307. Next, excessive adhesive material 309 that protrudes outside vents 307 to an external surface of conductive leadframe 304 is removed from electronic package assembly 300 using, for example, a grinding technique. Encapsulant 306 (not shown) is then appropriately connected to leadframe 304, and electronic package assembly 300 is removed from temporary tape 703.

Notably, although FIGS. 7 and 8 have been discussed with respect to a single electronic package assembly 300, one skilled in the art knows that during process 700 multiple electronic package assemblies 300 may be produced. As such, process 700 is not limited to producing a single electronic package assembly 300.

Moreover, although FIGS. 7 and 8 have been discussed with respect to a two layer metallization build-up process, one skilled in the art knows that during process 700 more than two layers may be produced. As such, process 700 is not limited to producing a specific number of layers.

Figure 9:
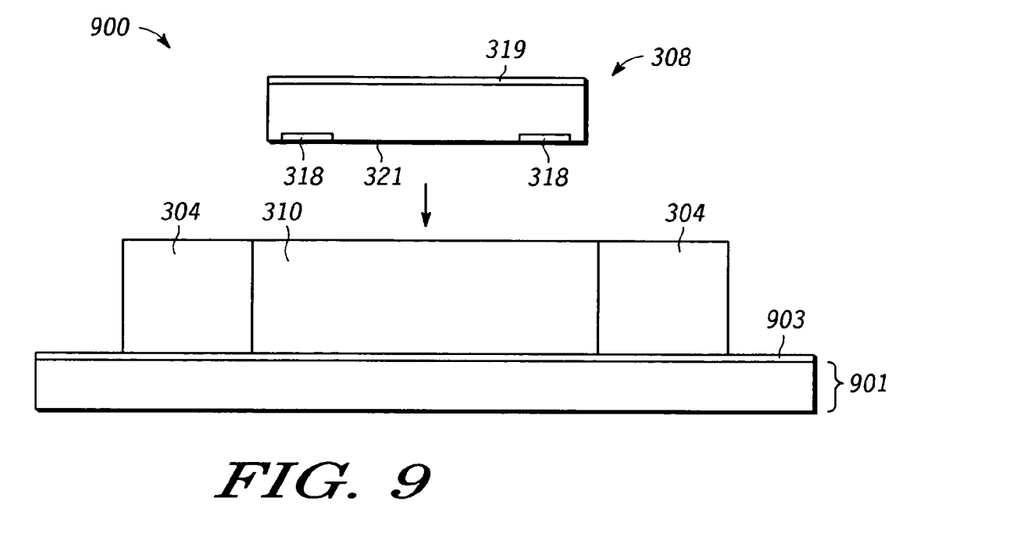
FIG. 9 is a cross-sectional overview of one step of an exemplary embodiment of another process to produce the electronic package assembly of FIG. 3.

FIG. 9 is a diagram of one step of exemplary embodiment of another process 900 to produce electronic package assembly 300. Process 900 initiates by providing a planar construction base 901 (e.g., a silicon wafer), whereupon which a temporary tape 903 is placed. Next, leadframe 304 is placed upon temporary tape 903 with cavity 310 configured as shown. Semiconductor die 308 is placed within cavity 310 with front side 321 (which includes active terminal bond pad contacts 318) contacting temporary tape 903 and back side 319 is oriented upward.

Figure 10:
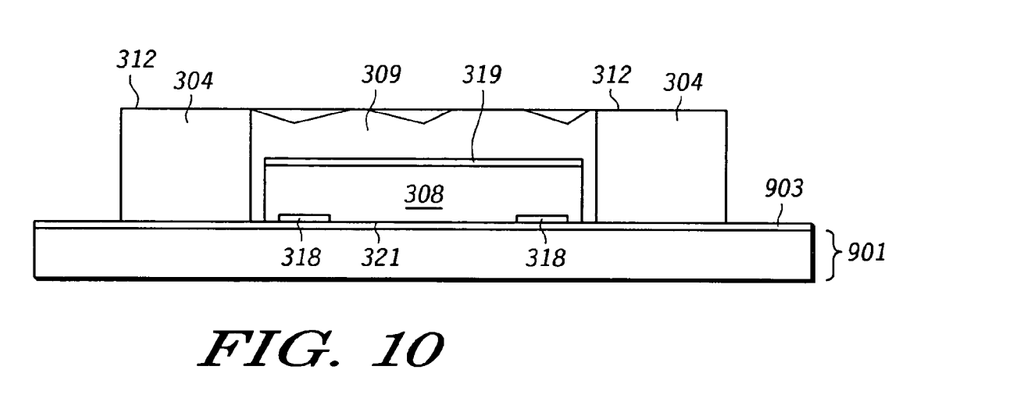
FIG. 10 is a cross-sectional overview of another step of the process of FIG. 9.

In accordance with one exemplary embodiment, a controlled amount of adhesive material 309 is then dispensed within cavity 310 such that adhesive material 309 is coplanar with or substantially coplanar with an upper surface 312 of leadframe 304 (see FIG. 10). Electronic package assembly 300 is then removed from temporary tape 903.

Notably, although FIGS. 9 and 10 have been discussed with respect to a single electronic package assembly 300, one skilled in the art knows that during process 900 multiple electronic package assemblies 300 may be produced. As such, process 900 is not limited to producing a single electronic package assembly 300.

Moreover, although FIGS. 9 and 10 have been discussed with respect to a two layer metallization build-up process, one skilled in the art knows that during process 900 more than two layers may be produced. As such, process 900 is not limited to producing a specific number of layers.

Figure 11:
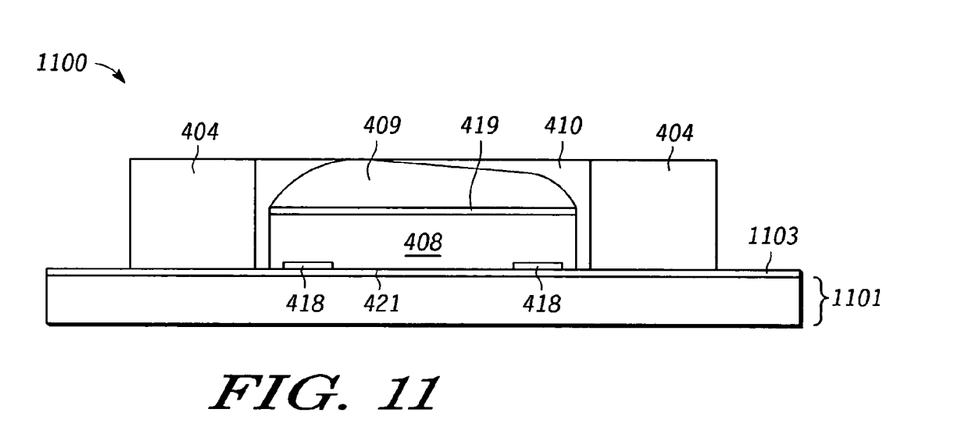
FIG. 11 is a diagram of one step of an exemplary embodiment of a process to produce the electronic package assembly of FIG. 4.
Figure 12:
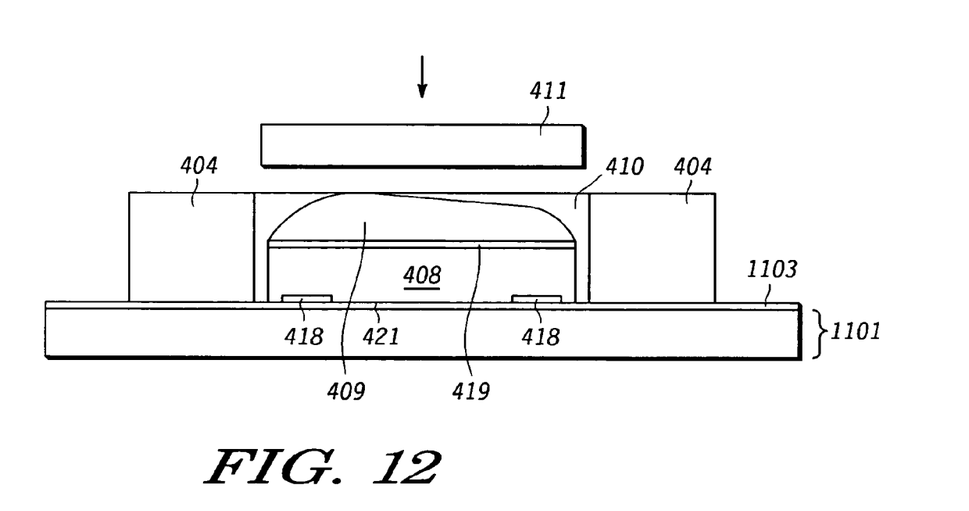
FIG. 12 is a cross-sectional overview of another step of the process of FIG. 11.
Figure 13:
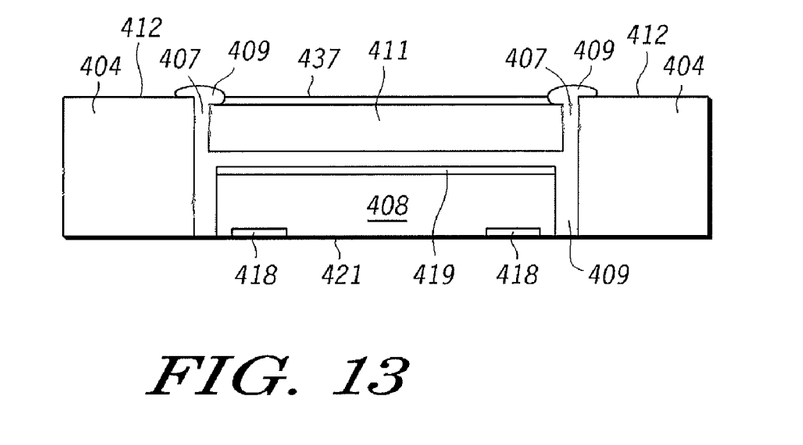
FIG. 13 is a diagram of yet another step of the process of FIG. 12.

FIGS. 11-13 are diagrams illustrating one exemplary embodiment of a process 1100 to produce electronic package assembly 400 (or an electronic package assembly 1400 discussed below). Process 1100 initiates by providing a planar construction base 1101 (e.g., a ceramic plate), whereupon a temporary tape 1103 is placed. Next, leadframe 404 is placed upon temporary tape 1103 such that a cavity 410 is formed. Semiconductor die 408 is placed within cavity 410 with front side 421 (which includes active terminal bond pad contacts 418) contacting temporary tape 1103 and back side 419 is oriented upward.

In accordance with one exemplary embodiment, a controlled amount of adhesive material 409 is then dispensed on backside 419 (see FIG. 12). With reference to FIG. 12, lid 411 is placed on adhesive material 409 with a controlled amount of pressure. The controlled amount of pressure should be such that an upper side 437 of lid 411 is coplanar with or substantially coplanar with upper surface 412 of leadframe 404 (see FIG. 13). Moreover, adhesive material 409 should substantially fill cavity 410 such that adhesive material 409 protrudes out of cavity 410 via vents 407.

Notably, although FIGS. 11-13 have been discussed with respect to a single electronic package assembly 400, one skilled in the art knows that during process 1100 multiple electronic package assemblies 400 may be produced. As such, process 1100 is not limited to producing a single electronic package assembly 400.

Moreover, although FIGS. 11-13 have been discussed with respect to a two layer metallization build-up process, one skilled in the art knows that during process 1100 more than two layers may be produced. As such, process 1100 is not limited to producing a specific number of layers.

Figure 14:
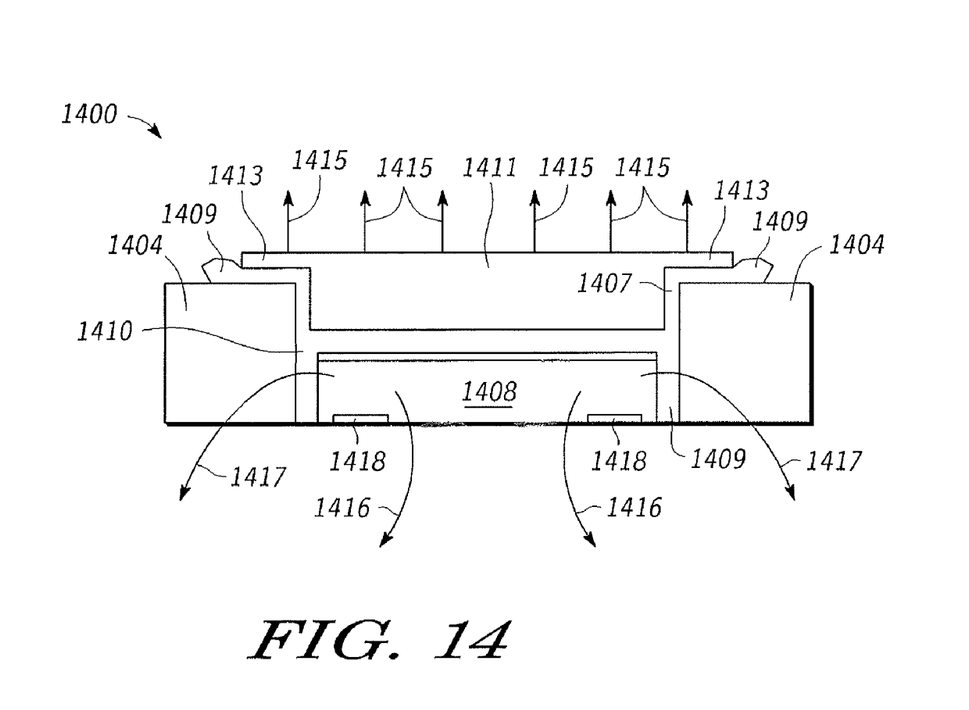
FIG. 14 is a diagram of an alternative embodiment of an electronic package assembly manufactured according to the processes discussed in FIGS. 11-13.

FIG. 14 is a diagram of an alternative embodiment of an electronic package assembly 1400 having a lid 1411 with lip 1413. Electronic package assembly 1400 includes a conductive leadframe 1404 connected to a semiconductor die 1408 (having active terminal bond pad contacts 1418) using a conductive adhesive material 1409 similar to conductive leadframe 404, semiconductor die 408, and adhesive material 409, respectively. In addition, adhesive material 1409 substantially fills a cavity 1410 such that a portion of adhesive material 1409 protrudes through vents 1407 similar to adhesive material 409 filling cavity 410 and protruding through vents 407. As such, heat dissipates from semiconductor die 1408 via heat paths 1415, heat paths 1416, and heat paths 1417 during operation of electronic package assembly 1400. In addition, a process to manufacture electronic package assembly 1400 is similar to process 1100 discussed above in FIGS. 11-13.

In summary, exemplary embodiments of the present invention include an electronic package assembly comprising a semiconductor die including a first side and a second side, wherein the first side includes at least one active area, and the second side includes at least one contact region. Furthermore, the package assembly also includes a conductive leadframe including a cavity formed therein and including a first surface and a second surface, the first surface and the second surface being substantially planar, and an adhesive material coupling the semiconductor die within the cavity of the conductive leadframe such that the first side of the semiconductor die is substantially coplanar with the first surface of the conductive leadframe, wherein the adhesive material is at least one of thermally-conductive and electrically-conductive.

In accordance with another embodiment, the conductive leadframe includes at least one vent extending from the cavity to the second surface of the leadframe. Moreover, the second surface of the leadframe, in one embodiment, is provided with a lid coupled to the cavity by the adhesive material, wherein the vent comprises a gap between the lid and the leadframe.

In one embodiment, the contact region on the second side of the semiconductor die is electrically continuous with the first side of the leadframe. In yet another embodiment, the contact region is a ground contact. In accordance with an embodiment, the adhesive material is a silver-filled epoxy. In another embodiment, the leadframe comprises copper. In accordance with yet another embodiment, the semiconductor die is a power amplifier. Moreover, the power amplifier, in one embodiment, is a radio frequency power amplifier.

Various exemplary embodiments also include a method of forming a package assembly comprising providing a semiconductor die including a first side and a second side, wherein the first side includes at least one active area, and the second side includes at least one ground contact region. Furthermore, the method includes providing a conductive leadframe including a cavity formed therein and including a first surface and a second surface, placing the die within the cavity such that the first side of the semiconductor die is substantially coplanar with the first surface of the conductive leadframe, and dispensing a thermally-conductive and electrically-conductive adhesive material within the cavity to couple the semiconductor die to the conductive leadframe.

Other embodiments include placing a conductive lid within the cavity of the leadframe. The method, in one embodiment, also includes placing the first side of the semiconductor die on a tape layer provided on a base plate, dispensing the adhesive material on the second side of the semiconductor die, attaching the conductive leadframe to a support structure slidably connected to the base plate, and sliding the base plate toward the semiconductor die such that the leadframe contacts the adhesive material. Moreover, the leadframe, in an embodiment, includes at least one vent extending from the cavity to the second surface of the leadframe, wherein the method further comprises applying a force to the conductive leadframe such that the adhesive material at least partially fills the vent.

In another embodiment, the method includes attaching the first surface of the die and the first surface of the leadframe to a planar structure including at least one thermal via formed therein such that the at least one thermal via is positioned to contact the first surface of the die. Furthermore, the method provides that the planar structure includes a plurality of build-up circuits.

Other embodiments include a power amplifier package assembly comprising a power amplifier semiconductor die including a frontside and a backside, wherein the frontside includes at least transistor device, and the backside includes at least one ground contact region. Furthermore, the power amplifier package includes a conductive leadframe having a cavity formed therein and including a first surface and a second surface, wherein the frontside of the power amplifier semiconductor die is substantially coplanar with the first surface of the conductive leadframe, and an adhesive material provided within the cavity to establish electrical and thermal connectivity therebetween.

In one embodiment, the conductive leadframe comprises copper. In another embodiment, the adhesive material is silver-filled epoxy.

In accordance with one embodiment, the power amplifier package assembly further includes a lid structure provided within the cavity and in contact with the adhesive material. Moreover, the leadframe, in one embodiment, includes an area that is greater than an area of the power amplifier die by a factor of at least 1.5.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A method of forming a package assembly comprising:
providing a semiconductor die including a first side, a second side, and sidewalls extending between the first side and the second side, wherein the first side includes at least one active area, and the second side includes at least one ground contact region;
providing a heat spreader including a cavity formed therein and including a first surface and a second surface, wherein the first surface of the heat spreader includes an opening to the cavity;
after providing the heat spreader, placing the die within the cavity of the heat spreader such that the first side of the semiconductor die is substantially coplanar with the first surface of the heat spreader;
after providing the heat spreader, dispensing a thermally-conductive and electrically-conductive adhesive material within the cavity to couple the ground contact region of the semiconductor die to the heat spreader, wherein the adhesive material encompasses the second side and the sidewalls of the semiconductor die, and the adhesive material, when cured, has a first surface that is substantially coplanar with the first surface of the heat spreader and the first side of the semiconductor die; and
after dispensing the adhesive material, attaching the first side of the die and the first surface of the heat spreader to a first side of a planar structure including one or more connected thermal vias formed therein such that the one or more connected thermal vias are positioned to contact the first surface of the heat spreader and to extend through the planar structure to provide a thermal conduction path from the at least one ground contact region, through the thermally-conductive and electrically-conductive adhesive material, through the heat spreader, and through the one or more connected thermal vias to a bottom surface of the planar structure.

2. The method of claim 1, wherein the planar structure includes a plurality of build-up circuits.

3. The method of claim 1, wherein providing the heat spreader includes providing a heat spreader comprising a copper alloy.

4. The method of claim 1, wherein providing the heat spreader includes providing a heat spreader having a surface area that is greater than approximately 1.5 times the surface area of the semiconductor die.

5. The method of claim 4, wherein the cavity has sides beveled outward toward the first surface of the heat spreader.

6. The method of claim 1, wherein providing the heat spreader includes providing a heat spreader having a cavity that has a shape substantially corresponding to a shape of the semiconductor die.

7. The method of claim 1, wherein providing the semiconductor die includes providing an RF power amplifier.

8. The method of claim 1, wherein the thermally-conductive and electrically-conductive adhesive material is a material selected from a group that includes a silver-filled epoxy and a solder material.

9. The method of claim 1, wherein the thermally-conductive and electrically-conductive adhesive material is a material having a thermal conductivity greater than 1.0 W/mK.

10. The method of claim 9, wherein the thermally-conductive and electrically-conductive adhesive material is a material having a thermal conductivity greater than 2.0 W/mK.

* * * * *